United States Patent
Alberto et al.

(10) Patent No.: US 10,852,342 B2
(45) Date of Patent: Dec. 1, 2020

(54) METHOD FOR DETECTING A FAULT OCCURRING IN A CABLE

(71) Applicants: Commissariat a l'energie atomique et aux energies alternatives, Paris (FR); Safran Electrical & Power, Blagnac (FR)

(72) Inventors: Diego Alberto, Corenc (FR); Vincent Heiries, Saint-Jean-de-Moirans (FR); Raphael Toufflet, Grenoble (FR); Christophe Trebosc, Blagnac (FR); Emmanuel Bussy, Blagnac (FR)

(73) Assignees: Commissariat a l'energie atomique et aux energies alternatives, Paris (FR); Safran Electrical & Power, Blagnac (FR)

( * ) Notice: Subject to any disclaimer, the term of this patent is extended or adjusted under 35 U.S.C. 154(b) by 0 days.

(21) Appl. No.: 16/206,419

(22) Filed: Nov. 30, 2018

(65) Prior Publication Data
US 2019/0170805 A1  Jun. 6, 2019

(30) Foreign Application Priority Data
Dec. 1, 2017  (FR) ..................... 17 61546

(51) Int. Cl.
  *G01R 31/08* (2020.01)
  *G01R 31/12* (2020.01)
  *G01N 1/00* (2006.01)
(52) U.S. Cl.
  CPC ......... *G01R 31/088* (2013.01); *G01R 31/083* (2013.01); *G01R 31/1209* (2013.01)
(58) Field of Classification Search
  CPC .... G01M 1/00; F41J 1/00; G01N 1/00; G01N 2201/00; G06T 1/00; G06T 2200/00
  See application file for complete search history.

(56) References Cited

U.S. PATENT DOCUMENTS

| 7,161,873 B2 | 1/2007 | Kuppuswamy et al. |
| 9,389,272 B2 | 7/2016 | Chaintreuil et al. |

(Continued)

FOREIGN PATENT DOCUMENTS

| CA | 2 503 077 A1 | 10/2005 |
| DE | 10 2010 051 213 A1 | 5/2012 |

(Continued)

OTHER PUBLICATIONS

French Preliminary Search Report dated Jul. 31, 2018 in French Application 17 61546, filed on Dec. 1, 2017 (with English Translation of Categories of Cited Documents & Written Opinion).

*Primary Examiner* — Jermele M Hollington
*Assistant Examiner* — Temilade S Rhodes-Vivour
(74) *Attorney, Agent, or Firm* — Oblon, McClelland, Maier & Neustadt, L.L.P.

(57) ABSTRACT

A method for detecting and locating a fault affecting an electrical cable includes the steps of (a) placing a first sensor and a second sensor along the cable, the second sensor being an acoustic sensor; (b) detecting the occurrence of the fault with the first sensor at a first time, and with the second sensor at a second time; (c) taking into account a propagation speed of an acoustic wave generated by the fault; (d) estimating a position of the fault depending on the first time and on the second time, on the basis of the propagation speed resulting from step (c); (e) determining a reference propagation speed depending on the position resulting from step (d) of the fault, and comparing said reference propagation speed with the propagation speed taken into account in step (c); and, (f) depending on the comparison, validating the position resulting from step (d) or reiterating steps (c) to (f) while adjusting, in step (c), the propagation speed taken into account.

11 Claims, 5 Drawing Sheets

(56) References Cited

U.S. PATENT DOCUMENTS

| | | |
|---|---|---|
| 2008/0027663 A1 | 1/2008 | Anderson et al. |
| 2013/0320983 A1* | 12/2013 | Stephan .................. G01V 3/10 |
| | | 324/326 |
| 2014/0238136 A1* | 8/2014 | Ten Grotenhuis .......................... |
| | | G01N 29/0654 |
| | | 73/592 |
| 2014/0260638 A1* | 9/2014 | Hood .................... G01N 29/14 |
| | | 73/647 |
| 2015/0198650 A1 | 7/2015 | Heiries et al. |
| 2015/0204935 A1* | 7/2015 | Klonowski .......... G01R 31/086 |
| | | 702/59 |
| 2015/0308917 A1* | 10/2015 | Soda .................... G01M 3/002 |
| | | 702/36 |
| 2017/0115256 A1 | 4/2017 | Chantz |

FOREIGN PATENT DOCUMENTS

| | | |
|---|---|---|
| FR | 2 940 459 A1 | 6/2010 |
| FR | 3 046 232 | 6/2017 |
| JP | 2001-21607 | 1/2001 |
| WO | WO 2011/118923 A2 | 9/2011 |
| WO | WO 2014/001466 A1 | 1/2014 |

\* cited by examiner

METHOD FOR DETECTING A FAULT OCCURRING IN A CABLE

TECHNICAL FIELD

The technical field of the invention is the detection and location of faults occurring in an electrically conductive cable.

PRIOR ART

The early detection and the location of faults generated in electrical installations, especially high- or medium-voltage electrical installations, is particularly important if the occurrence of major degradations is to be prevented. In this type of installation, poor connections, or mechanical damage caused to a cable, may engender the formation of electric arcs. Their detection, at an early stage, allows the formation of short-circuits or fires to be avoided. Complementing detection thereof, the location of faults in an electrical circuit makes maintenance operations easier, in particular in the case of electrical circuits that are complex or accessible only with difficulty.

Detection techniques based on the propagation of electrical signals and the analysis of their reflection, under the effect of the appearance of faults, have been developed, but these techniques may be complex to implement and have certain limitations, in particular with regard to the detection of false positives. They moreover require the impedance of the analysed circuits to be well known.

Patent application WO2014/001466 describes a device based on the use of an acoustic sensor, coupled to an electrical detecting means, to locate an electric arc in a cable. More precisely, a lag between an electrical signature and an acoustic signature of an electric arc is measured, the signatures being recorded at the same point of the cable. Advantage is then taken of the relative slowness with which the mechanical deformation wave, or acoustic wave, propagates, the latter allowing the presence of an electric arc to be located by taking into account a propagation speed of the acoustic wave along the cable. In this patent application, the propagation speed of the acoustic wave in a cable is considered to be uniform. It may vary, in particular as a function of temperature. Along a given cable, the propagation speed of the wave is assumed to be constant.

Patent application FR3046232 describes a method allowing the occurrence of an electric arc in a system to be detected using an acoustic sensor.

The inventors propose an improved method, allowing an electrical fault occurring in a cable to be more precisely located. Moreover, the proposed method is also suitable for detecting a fault of mechanical origin, for example a shock or a pressure exerting on the cable.

SUMMARY OF THE INVENTION

A first subject of the invention is a detecting method according to claim 1. More precisely, a first subject of the invention is a Method for detecting and locating a fault affecting a cable, the cable being configured to conduct an electrical current, the method comprising:
  a) placing a first sensor and a second sensor, the first sensor being able to detect the occurrence of a fault in the cable, the second sensor being able to detect an acoustic wave propagating along the cable, following the occurrence of the fault in the cable;
  b) detecting the occurrence of the fault:
    with the first sensor, at a first time,
    and with the second sensor, at a second time, subsequent or identical to the first time;
  c) taking into account a propagation speed of the acoustic wave generated by the fault;
  d) estimating a position of the fault depending on the first time and on the second time, on the basis of the propagation speed resulting from c);
  e) determining a reference propagation speed depending on the position estimated in d) of the fault, and comparing the reference speed with the propagation speed taken into account in step c);
  f) depending on the comparison,
    validating the position resulting from d);
    or reiterating c) to f) while adjusting, in c), the propagation speed taken into account.

According to one embodiment, called the acoustic-acoustic embodiment, the first sensor is an acoustic sensor. in d), the position of the fault is estimated by:
  calculating a time difference between the first time and the second time;
  comparing a distance between the first sensor and the second sensor, along the cable, to a distance obtained by multiplying the propagation speed of the acoustic wave, taken into account in c), by the time difference. The comparison may especially be a subtraction.

According to this embodiment, the acoustic first sensor and the acoustic second sensor are spaced apart from each other.

According to another embodiment, called the electric-acoustic embodiment, the first sensor is an electrical sensor, configured to measure an electrical signal propagating along the cable, and a variation generated by the fault in the electrical signal. in d), the position is estimated by:
  calculating a time difference between the first time and the second time;
  multiplying the propagation speed of the acoustic wave, taken into account in c), by the time difference.

Whatever the embodiment:
  in a reiteration of c) to f), the propagation speed taken into account in c) of an iteration corresponds to the reference speed determined in e) of the preceding iteration
  in e), the reference speed is determined using a propagation function describing a variation in the propagation speed of an acoustic wave, in the cable, as a function of the propagation distance of the acoustic wave.
  the reference function is determined beforehand.

A second subject of the invention is a device for detecting and locating the position of a fault in a cable, the cable being configured to conduct an electrical current, the device comprising:
  a first sensor, configured to detect the occurrence of a fault in the electrical cable;
  a second sensor, configured to detect an acoustic wave propagating along the cable following the occurrence of the fault in the cable;
  a processor, connected to the first sensor and to the second sensor, and configured to execute instructions to implement steps b) to f) of the method according to the first subject of the invention, on the basis of detection signals coming from each sensor.

The first sensor may be a sensor able to detect an acoustic wave propagating along the cable following the occurrence of the fault in the cable. In this case, the acoustic first sensor and the acoustic second sensor are spaced apart from each other. Alternatively, the first sensor may be an electrical sensor, able to measure an electrical parameter relative to the current flowing through the cable.

Another subject of the invention is a method for detecting a fault affecting a cable, the cable being intended to conduct an electrical current, the method comprising the following steps:
a) placing a first sensor and a second sensor, the first sensor and the second sensor being able to detect an acoustic wave propagating along the cable, following the occurrence of said fault in the cable between said sensors;
b) detecting the occurrence of the fault
  with the first sensor, at a first time,
  and with the second sensor, at a second time, subsequent to the first time;
c) taking into account a propagation speed of the acoustic wave generated by the fault;
d) estimating a position of the fault depending on the first time and on the second time, on the basis of the propagation speed resulting from step c);
the method being characterized in that the distance between the first sensor and the second sensor, along the cable, is larger than 10 metres, and preferably larger than 12 metres.

Other advantages and features will become more clearly apparent from the following description of particular embodiments of the invention, which are given by way of nonlimiting example, and shown in the figures listed below.

DESCRIPTION OF PARTICULAR EMBODIMENTS

Figure 1A:
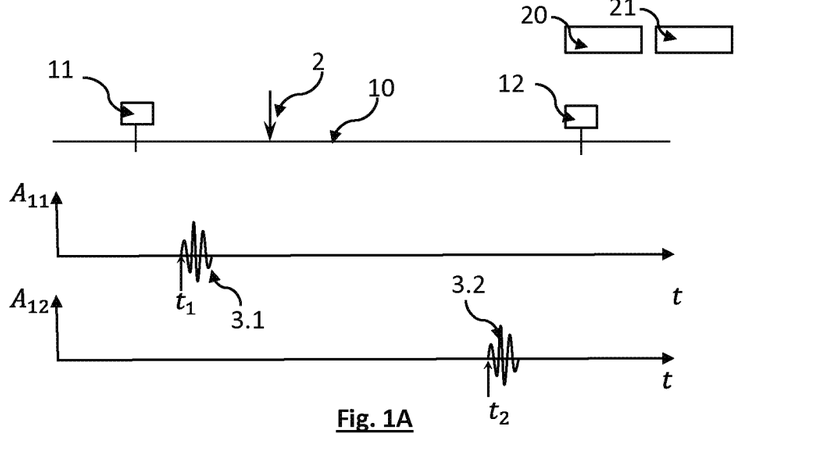
FIG. 1A shows a first configuration for implementing the invention, and the variations as a function of time in signals generated by two sensors of an ultrasonic wave, following the occurrence of a fault affecting an electrical cable, respectively.
Figure 1B:
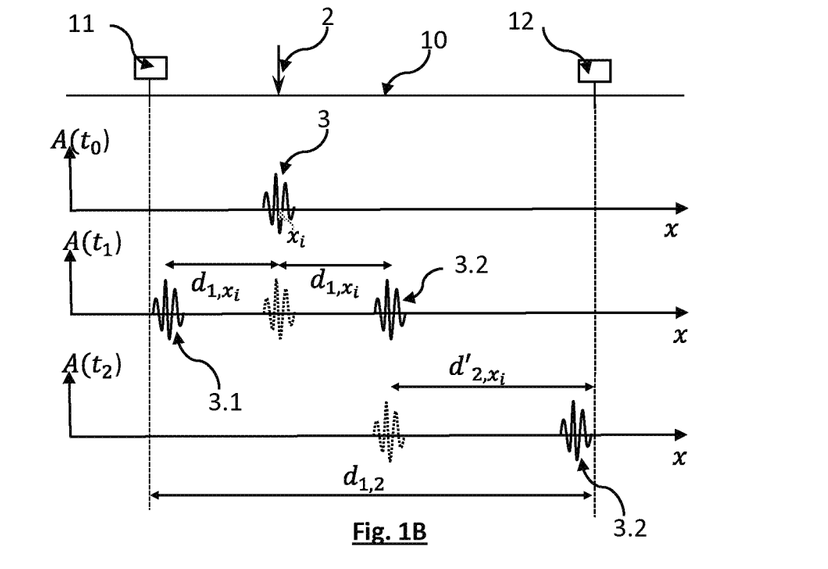
FIG. 1B shows the formation of an ultrasonic wave and its propagation towards the two acoustic sensors shown in FIG. 1A.

FIGS. 1A and 1B show a first configuration allowing the invention to be implemented. A cable 10 extends between an acoustic first sensor 11 and an acoustic second sensor 12. The expression "acoustic sensor" is understood to mean a sensor able to detect an acoustic wave propagating through a medium, in the present case the cable 10. The acoustic first sensor 11 and the acoustic second sensor 12 are connected to a microprocessor 20. The microprocessor 20 is configured to execute instructions stored in a memory 21 in order to implement the method described below. The sensors 11, 12 may be connected to the processor 20 by a wired link or a wireless link.

The cable 10 is an electrically conductive cable. It may in particular be a question of a cable having a metal core, for example made of aluminium or copper, covered with a tubular insulating cladding, the material from which the cladding is made for example being a supple plastic.

The cable experiences a fault 2 that it is sought to detect and to locate. The fault 2 affecting the cable 10 may be of electrical nature, particularly being an electric arc. The fault 2 may also be of mechanical nature, for example a mechanical shock exerted on the cable. It is represented by an arrow in FIGS. 1A to 1D. The occurrence of the fault leads to a formation of an acoustic wave 3, the latter propagating along the cable, in the form of two components 3.1 and 3.2 propagating in two opposite directions, towards the acoustic first sensor 11 and the acoustic second sensor 12, respectively. The acoustic wave is generally a wave of ultrasonic frequency, the frequency band typically being comprised between 30 and 500 kHz. The acoustic wave propagating along the cable is mainly what is called a longitudinal acoustic wave, in which the pressure, in the metal, is exerted parallel to the propagation direction. The cladding of the cable attenuates the acoustic waves that form in a transverse mode, these waves being surface acoustic waves.

The acoustic wave 3 that forms consecutively to the fault 2 propagates to the acoustic first and second sensor. The acoustic first and second sensors may be piezoelectric transducers, for example a resonant piezoelectric sensor of Mistras R15a type, which is particularly sensitive in the frequency band 30 kHz-200 kHz. The acoustic sensors may also be accelerometres, or electromechanical sensors. The measurement of the acoustic wave is generally carried out on the core of the cable, a measurement carried out on the cladding being subject to attenuation that may adversely affect the quality of the measurement. The first component 3.1, which propagates towards the acoustic first sensor 11, is detected at a first time $t_1$ whereas the second component 3.2, which propagates towards the acoustic second sensor 12, is detected at a second time $t_2$. In FIG. 1A, the variations $A_{11}(t)$ and $A_{12}(t)$ as a function of time in the amplitude of the signal measured by the acoustic first and second sensors 11 and 12, respectively, have been shown. Such a configuration is said to be an "acoustic-acoustic" configuration.

FIG. 1B shows the spatial distribution of the acoustic wave 3 and of its components 3.1 and 3.2. The fault 2 occurs at a time $t_0$. At this time, the acoustic wave 3 forms, the spatial distribution of which is schematically shown on the curve $A(t_0)$. A first component 3.1 of the acoustic wave 3 propagates towards the acoustic first sensor 11 and reaches the latter at the first time $t_1$. The spatial distribution of the acoustic wave along the cable at the first time $t_1$ is schematically shown on the curve $A(t_1)$, the initial acoustic wave 3 being shown in dotted form. If $x_i$ is a coordinate of the position of the fault 2 in the cable, the component 3.1 of the acoustic wave 3 has traveled a distance $d_1, x_i$, along the cable, between the times $t_0$ and $t_1$. A second component 3.2 of the acoustic wave 3 propagates towards the acoustic second sensor 12 and reaches the latter at the second time $t_2$, the latter being subsequent to the first time $t_1$. The spatial distribution of the acoustic wave along the cable at the second time $t_2$ is schematically shown on the curve $A(t_2)$, the second component 3.2, at the first time $t_1$ being shown in dotted form. Between the times $t_1$ and $t_2$, the second component 3.2 of the acoustic wave 3 travels, along the cable, a distance $d'_{2,x_i}$.

If v is the propagation speed of the acoustic wave along the cable, and more precisely between the fault 2 and the acoustic second sensor 12, the distance $d'_{2,x_i}$ traveled by the acoustic wave between the first time $t_1$ and the second time $t_2$ may be expressed by the expression:

$$d'_{2,x_i} = v \times \Delta t \quad (1)$$

where $\Delta t = t_2 - t_1$

The distance $d_{1,x_i}$ travelled by the wave until its detection by the first sensor 11 may be expressed by the expression:

$$d_{1,x_i} = \frac{d_{1,2} - d'_{2,x_i}}{2} = \frac{d_{1,2} - v \times \Delta t}{2} \quad (2)$$

and $$d_{1,x_i} = x_{11} - x_i \quad (2')$$

$d_{1,2}$ corresponding to the distance between the first sensor 11 and the second sensor 12. In this embodiment, $d_{1,2}$ is non-zero. This distance must be known.

Since the position $x_{11}$ on the cable of the first sensor 11 is known, Expression (2') allows the position $x_i$ of the fault in the cable to be obtained.

Figure 1C:
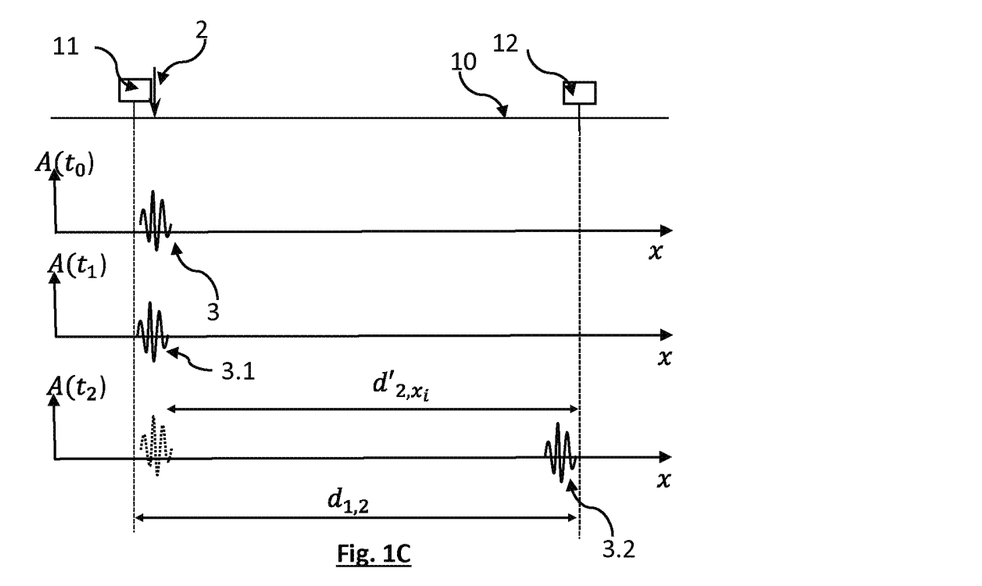
FIG. 1C shows another configuration of the first embodiment, in which the fault occurs in proximity to one sensor.

FIG. 1C shows an example in which the fault 2 is positioned level with the first sensor 11. In this case $d'_2$, $x_i = d_{1,2}$, and according to Equation (2), $d_{1,x_i} = 0$.

Detection of a fault 2 with an acoustic sensor has the advantage of allowing detection of an ultrasonic wave resulting from an electrical fault, for example an electric arc, or a mechanical fault, such as a shock or breakage. Thus, the use of an acoustic sensor allows detection both of a fault of electrical origin and of a fault of mechanical origin. The embodiment described above is particularly suitable for the detection and location of a fault 2 located between the two acoustic sensors. In this configuration, the expressions "acoustic first sensor" and "acoustic second sensor" are understood to mean the sensor located, along the cable 10, closest to and furthest from the fault, respectively.

Figure 1D:
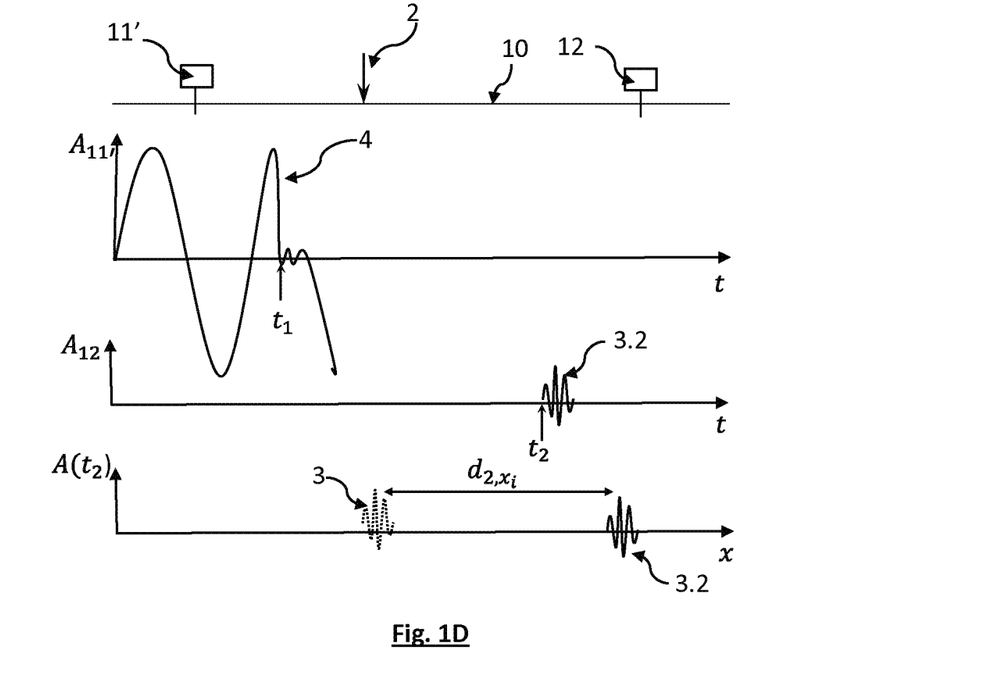
FIG. 1D shows a second configuration allowing the invention to be implemented, and variations as a function of time in signals generated by an electrical sensor and a sensor of an acoustic wave, following the occurrence of a fault affecting an electrical cable, respectively.

It is however not necessary for the two sensors used to be acoustic sensors. One of the sensors may be an electrical sensor. By electrical sensor, what is meant is a sensor that measures an electrical parameter of an electrical current flowing through the cable. It may especially be a question of a measurement of a voltage or of the magnitude of an electrical current, as described in WO2014/001466, which was cited in the description of the prior art, or even of a variation in the electrical resistance between two points of the cable. FIG. 1D shows a configuration, called the electric-acoustic configuration, in which the first sensor 11' is an electrical sensor whereas the second sensor 12 is an acoustic sensor. The occurrence of a fault 2 in the cable 10 induces an abrupt variation 4 in an electrical parameter level with the fault, this variation propagating along the cable 10 at a speed that may be considered to be equal to the speed of light. This variation 4 is measured by the first sensor 11' simultaneously to the occurrence of the fault, the time difference between the appearance of the fault and its measurement by the first sensor 11' being negligible. Thus, the first time $t_1$ of detection of the fault 2 by the first sensor 11' corresponds to the time to of occurrence of the fault 2. The position $x_i$ of the fault 2 in the cable 11' may be determined with respect to the position $x_{12}$ of the second sensor 12, using the expression:

$$d_{2,x_i} = v \times \Delta t \quad (3)$$

where $d_{2,x_i} = x_{12} - x_i \quad (4)$

Here v is the speed of propagation of the acoustic wave along the cable, between the fault 2 and the acoustic second sensor 12. $\Delta t = t_2 - t_1$, as described with reference to the preceding embodiment. This corresponds to the time interval between the detection of the fault 2 by the first sensor 11' and the detection of the fault 2 by the second sensor 12. In this embodiment, $\Delta t = t_2 - t_0$ because $t_1$ may be considered to correspond to the time of occurrence of the fault to.

Since the position $x_{12}$ on the cable of the second sensor 12 is known, Expression (4) allows the position $x_i$ of the fault in the cable to be obtained. FIG. 1D shows:

the variation $A_{11}(t)$ as a function of time in a signal measured by the electrical sensor 11';

the variation $A_{12}(t)$ as a function of time in a signal measured by the acoustic sensor 12;

the spatial distribution of the acoustic wave 3.2 along the cable, at the time $t_2$, the acoustic wave 3 at the time $t_0$ being shown in dotted form. A component 3.1 of the acoustic wave 3 also propagates towards the electrical sensor 11' but since the latter is not detected, it has not been shown in FIG. 1D.

Preferably, in such an embodiment, the acoustic sensor 12 is placed at one end of the cable. Specifically, otherwise, although the distance between the fault and the second sensor may be established using Expression (3), an uncertainty remains in the position of the fault with respect to the sensor, the fault possibly being located, at the calculated distance $d_{2,x_i}$, upstream or downstream of the acoustic sensor. The terms "upstream" and "downstream" must be understood to mean with respect to the direction of propagation of the electrical current in the cable. Such an uncertainty does not exist when the acoustic sensor is placed at the end of the cable. In the contrary case, it is preferable to provide an additional means in order to remove the uncertainty as to the position of the fault with respect to the acoustic sensor 12. In this embodiment, the second sensor 12 may be positioned in the same location as the first sensor 11'.

Whatever the adopted configuration, the detection, by an acoustic sensor, of the acoustic wave resulting from the occurrence of a fault may be achieved by determining the time at which the magnitude of the signal measured by the sensor exceeds a certain detection threshold. This detection threshold may be a preset value or, and preferably, a value dependent on the standard deviation of noise σ, measured in the absence of propagation of the acoustic wave. The standard deviation of noise may be periodically measured and the detection threshold may be considered to be equal to n times the standard deviation, n being a real positive number, with for example n=5. The detection may also be achieved as described in FR3046232, which was cited in the description of the prior art.

In the second example, the detection, by an electrical sensor 11, of the variation induced by the fault in the electrical parameter may be achieved by calculating a derivative of the variation as a function of time in the parameter in question. The detection threshold may be a threshold value of the derivative.

Contrary to the first embodiment, use of an electrical sensor does not allow a mechanical fault, such as a mechanical shock or rupture, to be detected. The embodiment illustrated in FIG. 1D is therefore limited to detection of a fault of electrical origin.

It will be noted that in the first embodiment, the method determines a distance between the first sensor 11 and the fault 2. In the second embodiment, the method determines a distance between the second sensor 12 and the fault 2.

Whatever the embodiment, the location of the fault requires the propagation speed v of the acoustic wave along the cable, and more precisely the speed of propagation of the acoustic wave between the fault 2 and the second sensor 12, to be taken into account, as Expressions (2) and (3) show. The second sensor is the sensor that detects the fault at a detection time $t_2$ subsequent or equal to the first detection time $t_1$. In the acoustic-acoustic configuration, the second sensor 12 is the acoustic sensor furthest from the fault. In the electric-acoustic configuration, the second sensor 12 is the acoustic sensor.

Figure 2:
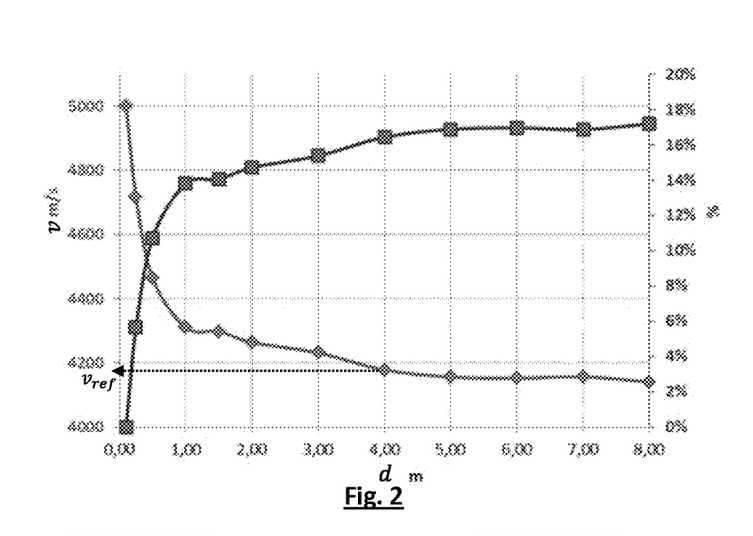
FIG. 2 plots the variation in the propagation speed of an ultrasonic wave in an electrical cable, and the attenuation of this speed as a function of the propagation distance of the wave along the cable.

In the prior art, such a speed is considered to be constant, and in particular to be independent of the distance between the fault and the acoustic sensor that detects the acoustic wave resulting from this fault. For example, in an aluminium rod, of similar geometry to that of a cable, the propagation speed of an acoustic wave is frequently considered to be equal to 5000 m·s$^{-1}$. In patent application WO2014/001466, the propagation speed of the acoustic wave in a copper cable is considered to be equal to 3350 m/s. However, in an electrical cable, the propagation speed of an acoustic wave is not constant. Specifically, the insulating cladding covering the core of the cable has an influence on the propagation speed of the acoustic wave, and in particular in the first metres from the fault, i.e. for small propagation distances. This influence is illustrated in FIG. 2, which shows the variation in the propagation speed v of an acoustic wave as a function of the propagation distance d with respect to the start point of the acoustic wave. This variation is shown by the curve the points of which are rhombuses.

The curve of FIG. 2 was obtained using a configuration such as that shown in FIG. 1C. Two Mistras R15a acoustic sensors were placed along a cable. A fault 2 was generated in immediate proximity to the first sensor 11, such that the detection time $t_1$ of the acoustic wave by the first sensor 11 could be considered to be synchronous with the occurrence of the fault. The distance $d_{1,2}$, corresponding to the propagation distance d of the acoustic wave 3.2 resulting from the fault and propagating towards the second sensor 12, was variable. At each distance $d_{1,2}$ the propagation speed v was obtained using the expression:

$$v = \frac{d_{1,2}}{\Delta t} \quad (5)$$

where $\Delta t = t_2 - t_1$, where $t_2$ corresponds to the time of detection of the acoustic wave 3.2 by the second sensor 12.

The fault 2 was generated using a method referred to as the "pencil lead break" (PLB) method. This method is described in the publication Sausse "Investigation of pencil lead break as acoustic emission sources", Acoust. Emission, 29 (2011), pp 184-196. The diameter and length of the pencil lead used were 0.5 mm and 3 mm, respectively, the pencil lead being of 2H type, and of 3.2 mm diameter. The cable used was a multi-strand AD10 aluminium cable covered with an annular Teflon cladding of 0.3 mm thickness. The contact angle of the pencil lead was 45°.

In the graph of FIG. 2, the propagation speed v may be seen to significantly decrease as the propagation distance d increases, this decrease being attributed to a dampening effect produced by the cladding. When the propagation distance is smaller than 1 metre, the propagation speed v rapidly decreases. This decrease corresponds an absorption, by the cladding, of transverse and surface propagation modes of the acoustic wave. Beyond a propagation distance of 1 metre, the decrease in the propagation speed v is less pronounced. Beyond 4 or 5 metres, the propagation speed v stabilizes at a value $v_{st}$ referred to as the stabilized value, the latter being, in this example, close to 4160 m·s$^{-1}$. In the same graph, the percentage loss of speed as a function of propagation distance has also been shown, which corresponds to the plot with the points of square shape.

The variation in the propagation speed v as a function of propagation distance, shown in FIG. 2, depends on the nature of the cable and in particular on the materials and dimensions of the conductive core and insulating cladding. Thus, for each cable in question, it is possible to establish a propagation function $f$, such as shown in FIG. 2, allowing a propagation speed $v_{ref}$, called the reference propagation speed, to be associated with an acoustic wave propagating through the cable, as a function of the propagation distance d of the wave. FIG. 2 shows a reference speed corresponding to a propagation distance of 4 metres.

To precisely locate a fault in a cable requires the propagation speed v of the acoustic wave between the fault and an acoustic sensor to be taken into account, in particular when the distance between the fault 2 and the second sensor 12 is smaller than 4 or 5 metres. However, the distance between the fault and the second sensor 12 is not known a priori. This is why one aspect of the invention consists in iteratively estimating the position of a fault, while taking into account the variation in the propagation speed, such as described with reference to FIG. 3A.

Figure 3A:
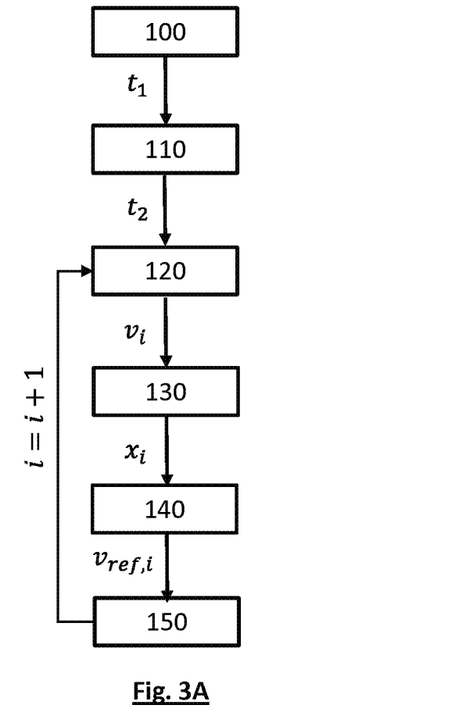
FIG. 3A schematically shows the steps of an embodiment of the invention.

FIG. 3A schematically shows the main steps of a method allowing the position of the fault to be located, the method being implementable in the "acoustic-acoustic" configuration described with reference to FIGS. 1A to 1C, or in the "electric-acoustic" configuration described with reference to FIG. 1D.

In a step 100, the first sensor 11 detects the acoustic wave 3.1, at a first time $t_1$. In a step 110, the second sensor 12 detects the acoustic wave 3.2 at a second time $t_2$, subsequent to the first time $t_1$ or equal to the latter.

Steps 120 to 150, which are described below, are carried out iteratively, the index i designating the rank of each iteration. This index is an integer higher than or equal to 1. The method may comprise only one iteration.

In a step 120, a propagation speed $v_i$ of the acoustic wave in the cable, between the fault and the second sensor 12, is taken into account. In the first iteration i=1, the speed $v_{i=1}$ taken into account is defined beforehand, for example 5000 m·s$^{-1}$.

In a step 130, the processor 20 determines a position $x_i$ of the fault in the cable, by applying, depending on the configuration implemented, Equations (2) and (2') or Equation (3), on the basis of the propagation speed $v_i$ taken into account in step 120.

In a step 140, a what is called reference propagation speed, corresponding to position $x_i$ determined in step 130 of the fault, is determined. More precisely, it is a question of determining the propagation speed of the wave knowing the propagation distance between the fault 2 and the second sensor 12. This propagation speed, which is called the reference propagation speed, may be established on the basis of the aforementioned propagation function $f$. The propagation function $f$ may be established from experimental data such as shown in FIG. 2. The step 140 may in particular comprise the following substeps:

the distance $d_{x_i,2}$ between the position $x_i$ of the fault, i.e. the position estimated in step 130, and the second sensor 12 is established;

using the propagation function $f$, a reference speed corresponding to a propagation distance equal to $d_{x_i,2}$: $v_{ref,i}=f(d_{x_i,2})$ (6) is determined.

In a step 150, the reference speed $v_{ref,i}$, established in step 140, is compared to the propagation speed $v_i$ of the acoustic wave taken into account in step 120. It is here a question of verifying whether the propagation speed taken into account indeed corresponds, to within an uncertainty, to the reference speed with which the acoustic wave propagates between the fault 2 and the acoustic second sensor 12.

When $v_{ref,i} \approx v_i$, the position of the fault $x_i$ is validated. The term designates an equality provided that a preset uncertainty, for example 5% or 10%, is taken into account.

When $v_{ref,i} \neq v_i$, steps 120 to 150 are reiterated, on the basis, in step 120, of a propagation speed different from that taken into account in the preceding iteration.

When steps 120 to 150 are reiterated, the propagation speed of the wave, in step 120, may be modified in a pre-established sequence, the propagation speed for example being gradually decreased or increased. Preferably, when $i>1$ the propagation speed $v_i$ of the wave taken into account in step 120 is determined depending on the reference speed $v_{ref,i-1}$ established in a preceding iteration. For example $v_i=v_{ref,i-1}$.

Figure 3B:
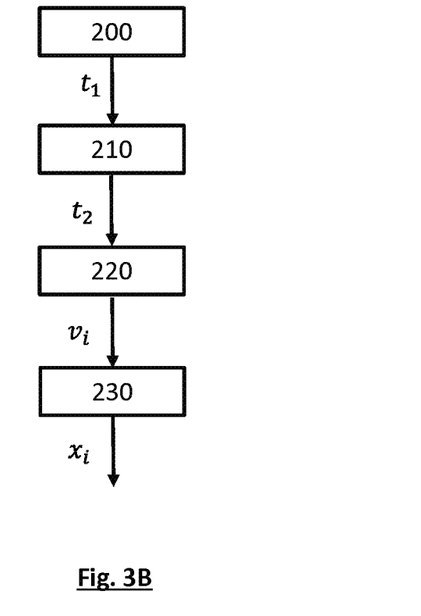
FIG. 3B schematically shows the steps of another embodiment of the invention.

FIG. 3B shows another embodiment, which is based on an acoustic-acoustic configuration such as described with reference to FIGS. 1A to 1C. In this embodiment, the acoustic first sensor and the acoustic second sensor are separated from each other by a distance larger than two times the distance required to obtain a stabilized propagation speed $v_{st}$, i.e. a propagation speed of the acoustic wave that no longer varies significantly with respect to the propagation distance, such as described with reference to FIG. 2. It is for example possible to consider that, beyond 8 metres, or even 10 metres or more, the acoustic sensors are sufficiently far apart from each other for the acoustic wave reaching the second sensor 12 to move at a speed corresponding to the stabilized propagation speed.

The steps of this embodiment are now described. In a step 200, the first sensor 11 detects the acoustic wave 3.1, at a first time $t_1$. In a step 210, the second sensor 12 detects the acoustic wave 3.2 at a second time $t_2$, subsequent to the first time $t_1$. In a step 220, the stabilized propagation speed $v_{st}$ of the acoustic wave is taken into account. In a step 230, the position $x_i$ of the fault is established, using Equation (2), with:

$$d_{1,x_i} = \frac{d_{1,2} - v_{st} \times \Delta t}{2} \quad (7)$$

When two acoustic sensors are employed, in the acoustic-acoustic configuration, the first embodiment is preferable provided that the propagation speed of the acoustic wave, between the fault 2 and the acoustic second sensor 12, has not reached the stabilized propagation speed $v_{st}$ defined above. Thus, in an acoustic-acoustic configuration, the first embodiment is advantageous provided that the distance between the two acoustic sensors is smaller than 10 m, or even 15 m. In the contrary case, the second embodiment is more advantageous.

Experimental Tests

The embodiment described in FIG. 3A was implemented using the cable described above, in an acoustic-acoustic configuration. The acoustic sensors 11 and 12 were separated from each other by a distance of 5 metres. The acoustic sensors were Mistras R15a piezoelectric sensors such as described above. The fault 2 was simulated using the pencil lead break (PLB) method described with reference to FIG. 2.

Figure 4A:
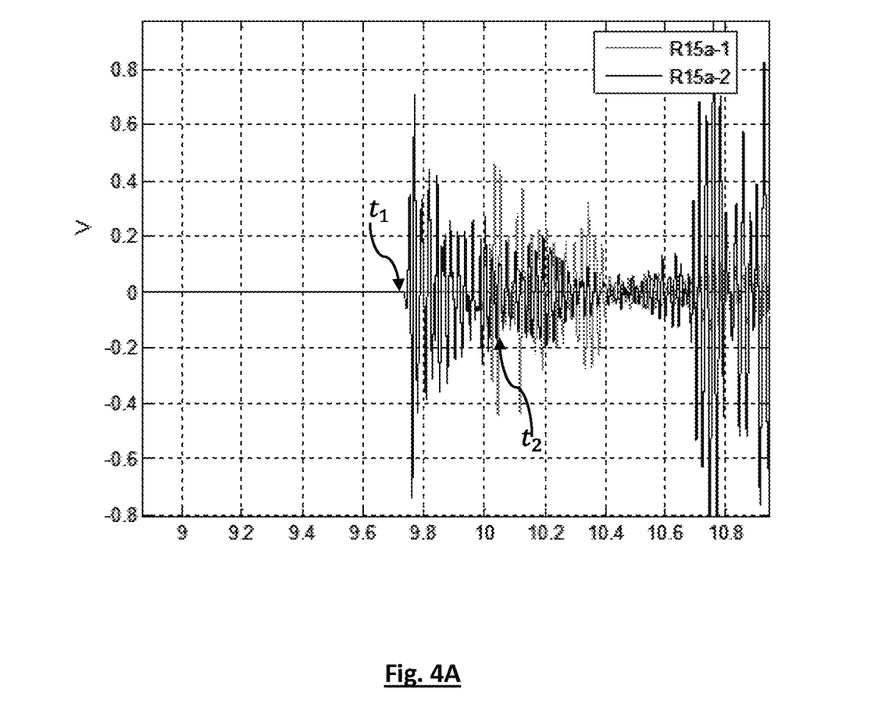
FIG. 4A shows variations as a function of time in signals detected by two acoustic sensors during experimental tests.

FIG. 4A shows the variation as a function of time in the amplitude of the signals delivered by each sensor. In this curve, the acoustic sensors are referenced R15a-1 and R15a-2. A threshold, for example of 5σ, was applied to determine the detection times $t_1$ and $t_2$. Five tests were carried out. Table 1 shows, for each test, the real distance $d_1,x_i$-real its estimation $d_1,x_i$ by the measurement and the discrepancy $\Delta$ between the measured value and the real value.

TABLE 1

| test | $d_1,x_i$ – real (m) | $d_1,x_i$ – mes (m) | $\Delta$ (m) |
|------|----------------------|---------------------|--------------|
| 1 | 1.000 | 1.009 | 0.009 |
| 2 | 1.500 | 1.506 | 0.006 |
| 3 | 2.300 | 2.302 | 0.002 |
| 4 | 3.000 | 3.008 | 0.008 |
| 5 | 4.300 | 4.314 | 0.014 |

The observed discrepancies demonstrate that the method allows the location of the fault to be precisely estimated. Two iterations were enough to achieve the results $d_1,x_i$-mes.

Figure 4B:
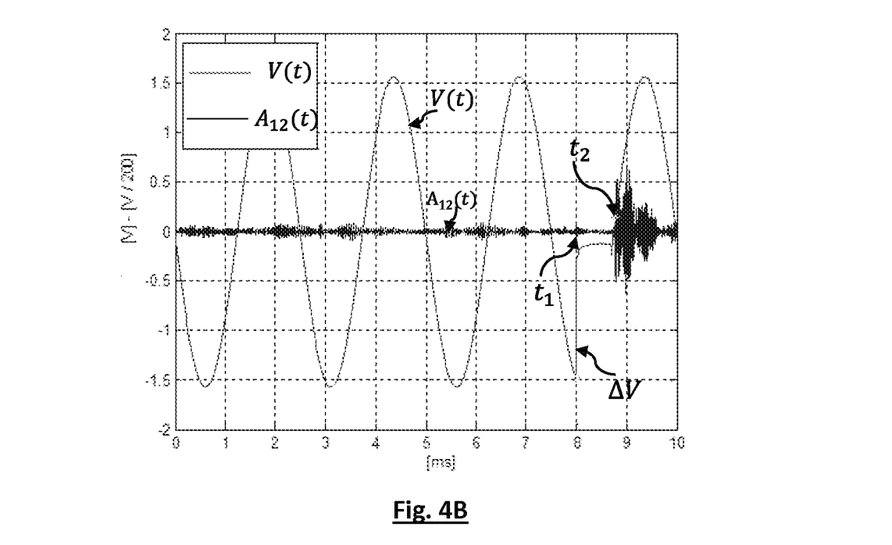
FIGS. 4B and 4C show variations as a function of time in an electrical signal and in an acoustic signal resulting from experimental tests.

Another series of tests was carried out using an electric-acoustic configuration such as shown in FIG. 1D. The electrical sensor 11' was a voltmeter, measuring a voltage V between the conductive metal of the cable and ground. The acoustic sensor 12 was a WSα Mistras sensor. The distance between the two sensors was 10 metres. FIG. 4B shows the variations V(t) and $A_{12}$(t) as a function of time in the signals measured by the electrical sensor and the acoustic sensor, respectively. The variation $\Delta$V in the voltage measured by the electrical sensor 11', allowing the first detection time $t_1$ to be determined, may in particular be seen. This detection time was determined by calculating a derivative with respect to time of the signal measured by the electrical sensor 11'.

Table 2 shows, for each test, the real distance $d_2,x_i$-real between the acoustic sensor and the fault, and its estimation by the measurement $d_2,x_i$-mes (m) and the discrepancy $\Delta$ between the measured value and the real value.

TABLE 2

| test | $d_2,x_i$ – real (m) | $d_2,x_i$ – mes (m) | $\Delta$ (m) |
|------|----------------------|---------------------|--------------|
| 6 | 3.06 | 3.16 | 0.1 |
| 7 | 8.00 | 7.93 | 0.07 |
| 8 | 10 | 9.89 | 0.11 |

It may once again be seen that the fault was located with precision.

Figure 4C:
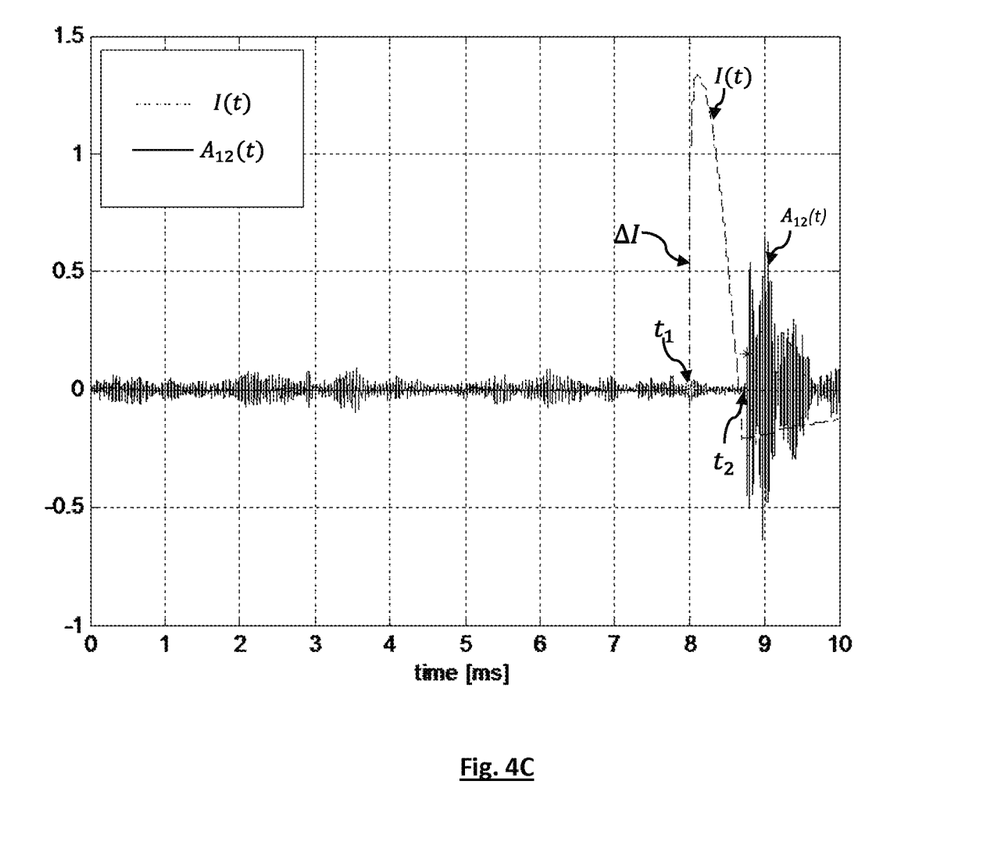

Another test was carried out, employing the electric-acoustic configuration, the electrical first sensor being an ammeter measuring a variation as a function of time in the magnitude I of the current flowing through the cable. FIG.

4C illustrates the detection of the first detection time $t_1$, corresponding to a variation $\Delta I$ in the magnitude, and of the second detection time $t_2$.

The invention will possibly be implemented to detect and locate faults in electrical circuits, for example in dwellings or industrial plants. It may for example be a question of electrical circuits forming electrical panels. The invention may also be applied to the inspection of on-board electrical equipment, for example of bundles of cables located on board a vehicle or an aircraft. It may also relate to the inspection of electrical equipment such as batteries. It will possibly also be applied to the detection of faults in underground or underwater cables.

The invention claimed is:

1. A method for detecting and locating a fault affecting a cable, the cable being configured to conduct an electrical current, the method comprising:
   a) placing a first sensor and a second sensor, the first sensor being able to detect the occurrence of a fault in the cable, the second sensor being able to detect an acoustic wave propagating along the cable, following the occurrence of the fault in the cable;
   b) detecting the occurrence of the fault with the first sensor, at a first time, and with the second sensor, at a second time, subsequent or identical to the first time;
   c) selecting a propagation speed of the acoustic wave generated by the fault;
   d) estimating a position of the fault depending on the first time and on the second time, on the basis of the propagation speed resulting from c);
   e) determining a reference propagation speed depending on the position estimated in d) of the fault, and comparing the reference propagation speed with the propagation speed resulting from c); and
   f) depending on the comparison,
      validating the position resulting from d); or
      reiterating c) to f) while adjusting, in c), the propagation speed
   wherein, in e), the reference propagation speed is determined using a propagation function describing a variation in the propagation speed of an acoustic wave, in the cable, as a function of the propagation distance of the acoustic wave.

2. The method according to claim 1, wherein the first sensor is an acoustic sensor, configured to detect the acoustic wave propagating along the cable.

3. The method according to claim 2, wherein, in d), the position of the fault is estimated by:
   di) calculating a time difference between the first time and the second time; and
   dii) comparing a distance between the first sensor and the second sensor, along the cable, to a distance obtained by multiplying the propagation speed of the acoustic wave, resulting from c), by the time difference.

4. The method according to claim 2, wherein, in d), the position of the fault is located between the first sensor and the second sensor.

5. The method according to claim 1, wherein the first sensor is an electrical sensor, configured to measure an electrical signal propagating along the cable, and a variation generated by the fault in the electrical signal.

6. The method according to claim 5, wherein, in d), the position is estimated by:
   di) calculating a time difference between the first time and the second time; and
   dii) multiplying the propagation speed of the acoustic wave, taken into account in c), by the time difference.

7. The method according to claim 1, wherein, in a reiteration of c) to f), the propagation speed of an iteration corresponds to the reference propagation speed determined in e) of the preceding iteration.

8. A device for detecting and locating the position of a fault in a cable, the cable being configured to conduct an electrical current, the device comprising:
   a first sensor, configured to detect the occurrence of a fault in the electrical cable;
   a second sensor, configured to detect an acoustic wave propagating along the cable following the occurrence of the fault in the cable; and
   a processor, connected to the first sensor and to the second sensor, and configured to execute instructions to implement steps c) to f) of the method according to claim 1, on the basis of detection signals coming from the first sensor and the second sensor.

9. The device according to claim 8, wherein the first sensor is a sensor configured to detect an acoustic wave propagating along the cable following the occurrence of the fault in the cable.

10. The device according to claim 8, wherein the first sensor is an electrical sensor, configured to measure an electrical parameter relative to the current flowing through the cable.

11. The method according to claim 1, comprising:
   determining the reference propagation speed depending on the position estimated in d) of the fault using a variable propagation speed which varies as a function of distance from the fault.

* * * * *